United States Patent [19]

Ghiraldi

[11] Patent Number: 4,798,238

[45] Date of Patent: Jan. 17, 1989

[54] SHELTER FOR THERMALLY CONDITIONING ELECTRONIC APPLIANCES

[75] Inventor: Alberto Ghiraldi, Milan, Italy

[73] Assignee: D.S.D.P. - S.p.A, Milan, Italy

[21] Appl. No.: 267,519

[22] Filed: May 27, 1981

[51] Int. Cl.⁴ .................... H01L 23/46; F28D 15/00
[52] U.S. Cl. .................... 165/32; 165/104.19; 165/104.33; 165/904; 361/383; 361/385
[58] Field of Search ............ 165/32, 104.19, 904, 165/104.33; 361/383, 385

[56] References Cited

U.S. PATENT DOCUMENTS

| | | | |
|---|---|---|---|
| 1,005,307 | 10/1911 | Randall | 165/904 |
| 1,945,975 | 2/1934 | Munters | 165/104.21 |
| 4,293,030 | 10/1981 | Rambach | 165/104.33 |
| 4,306,613 | 12/1981 | Christopher | 165/32 |

Primary Examiner—Albert W. Davis, Jr.
Attorney, Agent, or Firm—Wenderoth, Lind & Ponack

[57] ABSTRACT

This invention relates to a shelter for thermally conditioning in particular electronic appliances which generate heat. The shelter comprises a closed box-like structure with thermoinsulating walls which houses the appliance to be conditioned, as well as a heat accumulator in the form of a fluid mass in heat exchange conditions with the structure inner environment. The heat accumulator is connected with a heat exchanger provided outside the box-like structure in such a manner that a fluid circulation, preferably a thermosiphon circulation, is established only when the fluid temperature within the heat exchanger is lower than that within the heat accumulator.

5 Claims, 1 Drawing Sheet

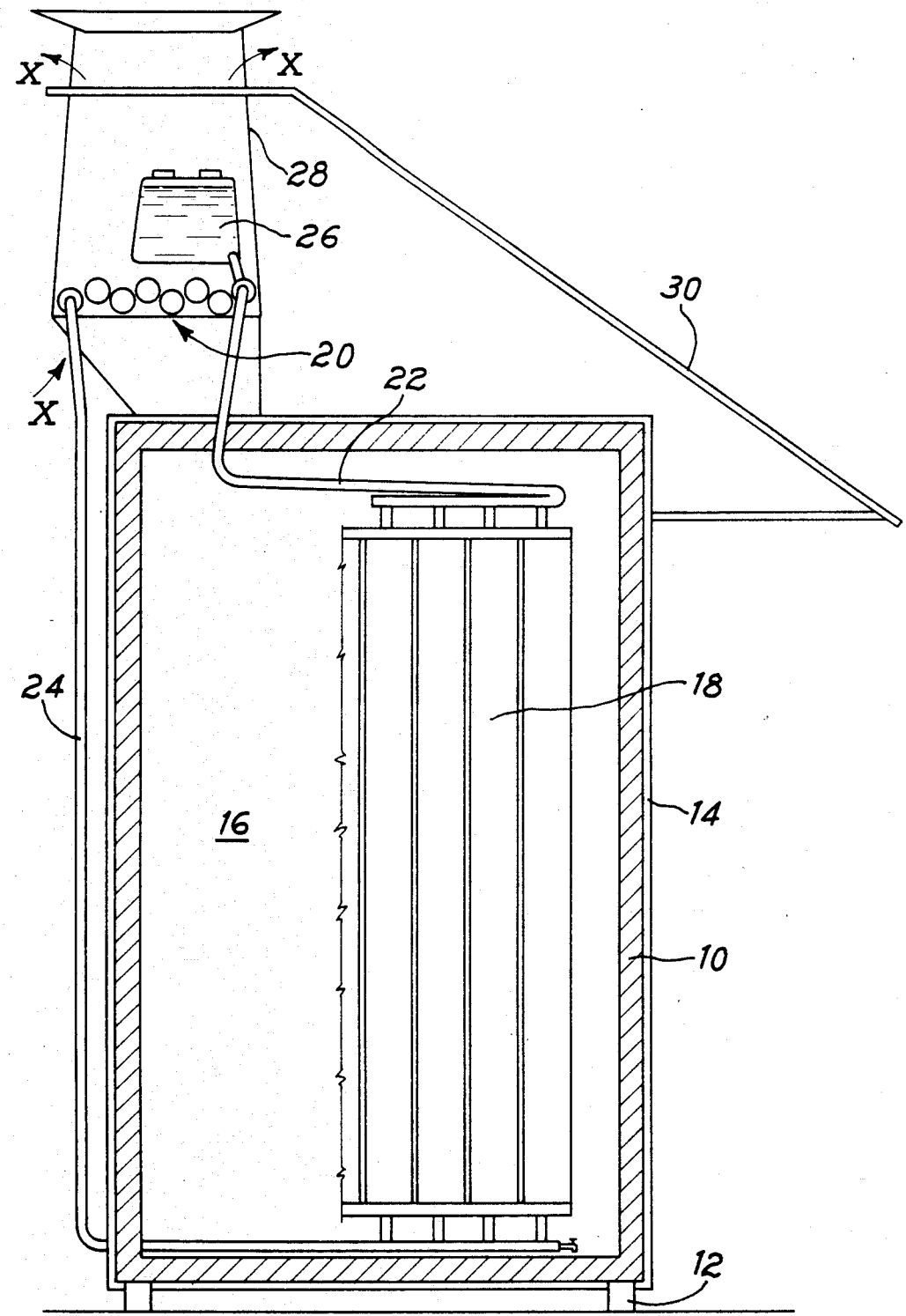

SHELTER FOR THERMALLY CONDITIONING ELECTRONIC APPLIANCES

BACKGROUND OF THE INVENTION

1. Field of the Invention

This invention relates to a box-like device, called a "shelter" for thermally conditioning different apparatuses, in particular electronic appliances which generate heat in use, the shelter comprising a closed box-like structure with thermoinsulating walls, which houses the apparatuses and at least one heat accumulator, in the form of a fluid mass in heat exchange conditions with the structure inner environment.

2. Description of the Prior Art

As is known, for a reliable operation of many apparatuses, namely electronic appliances, it is necessary that the environment wherein these apparatuses are placed be maintained within a temperature range which is usually very narrow, and this should be done taking into account that the apparatuses generate and disperse heat in the environment. Further, of course, these apparatuses must be made weather-proof.

Taking into account that the apparatuses are sometimes placed in locations difficult to be joined for maintenance, it is then necessary to house the same within box-like structures which sometimes have the sizes of a room or larger, and discharge toward the outside the heat generated by the apparatuses. In order to attain the above objectives, many types of shelters are used, namely:

(A) thermally insulated shelters, wherein the inner heat is dissipated through the walls;

(B) thermally insulated shelters with an air conditioner (which is obviously operated by a suitable motor means);

(C) thermally insulated shelters with an inner thermal capacity, which is usually very large, in order to allow a heat dissipation toward the outside, as in case A, and maintain an inner temperature which is the sum of the mean outer temperature (between the day and the night) and of an overtemperature due to the inner heat as generated by the appliances.

This latter shelter has been described and claimed in the U.S. patent application Ser. No. 949,382 filed on Oct. 6, 1978 by the same Inventor which is now U.S. Pat. No. 4,263,963, granted Apr. 28, 1981, to which reference is made for a better understanding of the features and operational requirements of these shelters.

Taking into account that the shelters must have walls of light weight and then with a reduced thermal capacity, it is to be pointed out that the outer temperature changes are quite immediately followed by similar temperature changes of the inner environment in shelters A. Accordingly this environment can join the maximum outer temperature plus an overtemperature due to inner appliances, so that these shelters can be used only in temperate climates and for appliance reduced powers.

The shelters B are very expensive in operation and maintenance due to the use of an air conditioner which requires maintenance and is power consuming, this being particularly true when the shelters are placed in desert zones difficult to be joined.

The shelters C can operate also with high outer maximum temperatures, on condition that the mean temperature in a period of 24 hours be maintained within a required range. Generally speaking, these shelters C are suitable for relatively low mean temperatures and relatively reduced appliance powers.

OBJECTS OF THE INVENTION

An object of this invention is to provide a new and improved shelter which overcomes the abovestated drawbacks and in particular allows a relatively high power in heat form to dissipate toward the outside, by maintaining the inner temperature within a desired range even with a very high daily mean and maximum temperatures, without the need of power to effect the thermal conditioning.

SUMMARY OF THE INVENTION

According to this invention, the above and further objects are attained by a shelter of the type as above specified, further comprising at least a heat exchanger in heat exchange conditions with the outer environment, which is placed outside the shelter box-like structure and is connected to a heat accumulator by means of ducts allowing a fluid circulation in a closed circuit, and wherein means are provided for establishing the fluid circulation only when the fluid temperature in the heat exchanger is lower than that in said heat accumulator.

Accordingly, while the combination of the insulating structure and the heat accumulator allows to join and maintain inner temperatures of the order of the daily mean outer temperature, plus the overtemperature due to appliances, said outer heat exchanger, which acts during the coldest hours in a day, contributes to further reduce the inner temperature.

BRIEF DESCRIPTION OF THE DRAWING

The attached drawing is a diagrammatic cross-sectional view along a vertical plane of a shelter according to the invention.

DESCRIPTION OF THE PREFERRED EMBODIMENT

With reference to the drawing, the shown shelter substantially comprises a closed box-like outer structure formed by thermoinsulating walls 10, which are generally very light and are supported by supporting and reinforcing means 12, 14 so at to define a closed inner environment 16 to which the outer heat is fed in a minimum quantity during the hottest hours of the day, due to thermoinsulating features of walls 10. The environment 16 houses the appliances to be protected (not shown) as well as a heat accumulator, for instance in the form of a suitably sized and shaped tank 18 which extends vertically nearly the entire height of the interior of the environment 16 wherein a suitable fluid, preferably a liquid such as water, is contained. The liquid is in heat exchange conditions with the environment 16, due to a suitable outer shape of the tank 18, as is well known in the heat exchange field. The heat accumulator clearly operates in such a manner as to take up both the appliance heat and the heat coming from the walls 10 during the hottest hours of the day hindering an excessive temperature increase within the inner environment 16.

According to this invention, the above described shelter further comprises one or more heat exchangers 20 which are placed outside the structure 10–14 and then subjected to the outer environmental conditions, the exchangers being connected by means of ducts 22, 24 in a closed circuit with the heat accumulator 18. Further, means are provided for circulating the fluid of the tank 18 in the closed circuit only when the fluid temperature within the heat exchanger(s) 20 is lower than that within the heat accumulator 18.

Actually, the heat exchangers 20 are placed in a position vertically higher than that of the accumulator 18 and are fluidically connected with the accumulator 18 by a delivery tube 22 which draws the fluid from an upper part of the accumulator 18, as well as by a backflow tube 24 which has its outlet at a lower part of the accumulator 18. Of course, the tubes 22 and 24 pass through the thermoinsulating walls 10.

The heat exchangers 20, which have suitable fins (not shown) and are connected to an expansion tank 26 in order to compensate for any fluid thermal expansions, are suitably housed under a hood 28 wherein a natural circulation of the air shown by arrows X is established in order to improve the heat exchange conditions.

As the heat exchangers are in a position higher than that of the accumulator 18 and the accumulator extends vertically from the ceiling to the floor of the structure to provide a water head as high as possible between the accumulator and the heat exchangers to enhance the circulation speed of the heat tranfer liquid, a thermosiphon circulation is established between the accumulator 18 and the heat exchangers 20 only when the liquid within the heat exchangers 20 is colder than that within the accumulator 18. On the contrary, when the liquid temperature does not fulfil the above condition, during the hottest hours of the day, the circulation is stopped and the liquid in the accumulator 18 effects a heat exchange with only the environment 16.

An overhanging protecting roof 30 has a double function of protecting the shelter against both the sun rays and the mechanical action of weather agents.

From the above description, it can be understood that it is possible to have an inner temperature lower than the sum of the outer day mean temperature and of the overtemperature due to the appliances. Further, by means of the outer heat exchanger(s) it is possible to dissipate heat due to high heat output of the appliance and in any case appliance heat which is higher than that which can be dissipated through the walls.

Three basic advantages are then obtained, namely:

(i) a relatively low inner temperature, also with high day maximum outer temperatures;

(ii) a high dissipation of heat due to appliance power, so that high power appliances can be housed within the shelter;

(iii) an avoidance of any continuous maintenance and energy feeding for air conditioners.

According to an embodiment of this invention, an inner environment of the following sizes was foreseen: 2000×3000×3150 mm. The thermoinsulating walls had a thickness of about 100 mm and the inner tanks 18 a maximum capacity of about 1000 liters, with a dissipating surface area of the outer exchangers 20 of about 70 m². These exchangers were housed in a hood 28 for improving the air circulation. The power dissipated within the environment 16 was of 350 W.

With an outer temperature between 44° C. and 28° C., a maximum inner temperature of 37°-38° C. was reached.

It is to be pointed out that, while this invention has been described with reference to a preferred embodiment thereof, different modifications may be made thereto by those skilled in the art, without departing from the spirit and scope of the appended claims.

I claim:

1. A self-contained shelter providing a thermally conditioned environment in a well defined temperature range for an apparatus, said shelter comprising:
    a closed box having a ceiling, a floor and thermoinsulating walls defining an internal environment for housing the apparatus;
    at least one heat accumulator means for taking up heat within the internal environment, said heat accumulator means containing a heat transfer liquid in heat exchange relationship with the internal environment of the box;
    at least one heat exchanger means for circulating the heat transfer liquid from the heat exchange relationship with the internal environment to a heat exchange relationship with an external environment outside of the box;
    said heat exchanger means being located in a position higher than that of said heat accumulator means and connected thereto by a single closed heat transfer loop for allowing a thermosiphon circulation of the liquid contained in said accumulator means to the heat exchanger means only when the fluid temperature within said heat exchanger means is lower than that within said heat accumulator means;
    said heat accumulator means extending vertically from the ceiling to the floor of the box so as to provide a water head as high as possible between said heat accumulator means and said heat exchanger means in order to enhance the circulation speed of said heat transfer liquid; and
    said heat exchanger means is connected to an expansion tank.

2. A shelter according to claim 1, wherein said heat exchanger means is housed in a hood to establish a natural air circulation impinging the heat exchanger external surfaces.

3. A shelter according to claim 1, wherein a protecting roof is provided on the top of said shelter in order to protect it against sun rays and the weather.

4. A shelter according to claim 1, wherein said single closed heat transfer loop comprises a delivery tube connected between an upper end of said heat accumulator means adjacent the roof of the box and said heat exchanger means and a backflow tube connected between said heat exchanger means and a lower part of said accumulator means adjacent the floor of the box.

5. A shelter according to claim 1, wherein a hood which is open at a top and a bottom thereof extends vertically above said box, said heat exchanger means being provided within said hood adjacent the bottom thereof, and said expansion tank is provided within said hood between said heat exchanger means and the top of the hood.

* * * * *